(12) United States Patent
Wang et al.

(10) Patent No.: US 8,942,939 B2
(45) Date of Patent: Jan. 27, 2015

(54) REAL-TIME DETECTION SYSTEM AND THE METHOD THEREOF

(75) Inventors: Jia Wang, Taipei (TW); Fuh-Yu Chang, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 665 days.

(21) Appl. No.: 13/113,844

(22) Filed: May 23, 2011

(65) Prior Publication Data

US 2012/0130682 A1 May 24, 2012

(30) Foreign Application Priority Data

Nov. 18, 2010 (TW) .............................. 99139719 A

(51) Int. Cl.
*G01R 23/16* (2006.01)
*G01M 13/02* (2006.01)
(Continued)

(52) U.S. Cl.
CPC ......... *G01M 13/028* (2013.01); *G06K 9/00536* (2013.01); *G06K 9/00496* (2013.01); *G01R 23/16* (2013.01); *G06F 17/18* (2013.01)
USPC .................. 702/77; 702/44; 702/57; 702/81; 702/182; 702/189

(58) Field of Classification Search
USPC .................................................... 702/77, 189
See application file for complete search history.

(56) References Cited

U.S. PATENT DOCUMENTS

| 5,565,872 | A | 10/1996 | Prevatt et al. |
| 6,728,645 | B1 | 4/2004 | Kozlov et al. |
| 2010/0023307 | A1* | 1/2010 | Lee et al. ........................... 703/7 |
| 2010/0169030 | A1* | 7/2010 | Parlos ............................. 702/58 |
| 2011/0199861 | A1* | 8/2011 | Lapidot ........................... 367/74 |

FOREIGN PATENT DOCUMENTS

| EP | 2208981 A1 * | 7/2010 |
| TW | 200819723 | 5/2008 |
| TW | 201125536 | 8/2011 |

OTHER PUBLICATIONS

Zhang, L., Xiong, G., Liu, H., Zou, H., and Guo, W. Bearing Fault Diagnosis Using Multi-Scale Entropy and Adaptive Neuro-Fuzzy Inference. Expert Systems with Applications [online], Aug. 2010 [retrieved on Nov. 27, 2013]. Retrieved from the Internet: <http://www.sciencedirect.com/science/article/pii/S0957417410001570>.*

(Continued)

*Primary Examiner* — Sujoy Kundu
*Assistant Examiner* — Paul D Lee
(74) *Attorney, Agent, or Firm* — Patterson & Sheridan, LLP

(57) ABSTRACT

The invention discloses a real-time detection system for detecting the real-time machining by a rotating machine or rotating quality thereof. The real-time detection system comprises a signal capture module, a preprocessor, a processor and a comparison module. The signal capture module is used to capture a time-sequence signal of the rotating machine. The preprocessor is coupled to the signal capture module for receiving the time-sequence signal and generating a stationary time-sequence signal. The processor is coupled to the preprocessor for receiving the stationary time-sequence signal and calculating a plurality of entropies of the stationary time-sequence signal. The comparison module with an entropy table or a feature judgment mechanism of the entropy variation is coupled to the processor for receiving the plurality of entropy and comparing the plurality of entropy according to the entropy table or the feature judgment of the entropy variation and generating a quality signal.

9 Claims, 2 Drawing Sheets

(51) Int. Cl.
*G06K 9/00* (2006.01)
*G06F 17/18* (2006.01)

(56) References Cited

OTHER PUBLICATIONS

Lin, J., Liu, J., Li, C., Tsai, L., Chung, H. Motor Shaft Misalignment Detection Using Multiscale Entropy with Wavelet Denoising. Expert Systems with Applications [online], Oct. 2010 [retrieved on Nov. 27, 2013]. Retrieved from the Internet: <http://www.sciencedirect.com/science/article/pii/S0957417410002800>.*

Wang, et al., Constructing the rotary machine real-time detection system using multiscale entropy-machinery method M9703236, Jul. 20, 2010 (English Abstract).

Office Action dated Dec. 6, 2013 for corresponding Taiwan Patent Application Serial No. TW0990091.

* cited by examiner

REAL-TIME DETECTION SYSTEM AND THE METHOD THEREOF

BACKGROUND OF THE INVENTION

1. Field of the Invention

The present invention relates to a real-time detection system and the method thereof. More particularly, the present invention relates to a real-time detection system and the method thereof which are used to detect the real-time machining by a rotating machine or rotating quality of a rotating machine.

2. Description of the Prior Art

Rotating machines or machining with rotating machines are common systems or commonly used in the industry. In the field of the rotating machines, because the demand of the processing becomes harder, the demand of the quality becomes highly accurate and standard.

Take the machining for example, with the increasing of the product complexity, when the quality of the product is improved, the optimization of features shall be considered. Therefore, the optimized cutting frequency (or speed), tool wearing, surface roughness and cutting forces are the goals of the processing. The work type of the rotating machines is a dynamic behavior which is composed by a lot of operation modes. When a parameter or an operation factor changes, the product or machine will be broken and become dangerous. In the prior art, the Fast Fouier Transform (FFT) and the root mean square (RMS) are used to be analytic tools, but it is difficult to find the problems. For the detection way with the Fast Fouier Transform, only few basic operating characteristics related to frequency only can be detected. The RMS algorithm can calculate and detect the strength variation of the vibration fast, but the type of the problem cannot be known since the distribution of the frequency cannot be detected.

To sum up, the detection of the rotating machine cannot meet the demand of processing in the prior art, since the rotating machine's vibration presents non-stationary usage. It is difficult to make an accurate evaluation of the working condition through the analysis only in frequency or time domain. Furthermore, the theories of the analysis are too difficult to be known, so that only the professionals can analyze the outcome of the analysis. Thus, the detection technology with high accuracy and effectiveness shall be developed.

Therefore, it is necessary to provide a real-time detection system and the method thereof which are used to detect the real-time machining by a rotating machine or rotating quality of a rotating machine to solve the problems in the prior art.

SUMMARY OF THE INVENTION

Accordingly, one scope of the invention is to provide a real-time detection system and the method thereof. More particularly, the present invention relates to a real-time detection system and the method thereof which are used to detect the real-time machining by a rotating machine or rotating quality of a rotating machine.

The invention discloses a real-time detection system for detecting the real-time machining by a rotating machine or rotating quality of a rotating machine. The real-time detection system comprises a signal capture module, a preprocessor, a processor, and a comparison module. The signal capture module is used to capture a time-sequence signal of the rotating machine. The preprocessor is coupled to the signal capture module for receiving the time-sequence signal and generating a stationary time-sequence signal by a Fourier Transform. The processor is coupled to the preprocessor for receiving the stationary time-sequence signal and calculating a plurality of entropies of the stationary time-sequence signal by a predetermined way. The comparison module is coupled to the processor and comprises an entropy table or a feature judgment mechanism of the entropy variation. The comparison module is used to receive the plurality of entropies and compare the plurality of entropies according to the entropy table or the feature judgment mechanism of the entropy variation and generate a quality signal.

In practice, each entropy is calculated by a multiscale entropy (MSE) algorithm with one of a plurality of calculating scales in the processor. Additionally, the predetermined way further comprises a capturing period and a scale sampling standard, wherein the capturing period is n×T, n is a natural number, T is a work cycle of the rotating machine. And the predetermined way further comprises a scale sampling standard, the scale is larger than twenty.

Furthermore, the invention discloses a method of real-time detection for detecting the real-time machining by a rotating machine or rotating quality of a rotating machine comprising the following steps of: (S1) capturing a time-sequence signal of the rotating machine; (S2) generating a stationary time-sequence signal by a Fourier Transform; (S3) calculating a plurality of entropies of the stationary time-sequence signal by a predetermined way and (S4) comparing the plurality of entropies according to the entropy table or the feature judgment mechanism of the entropy variation and generating a quality signal.

In practice, each entropy is calculated by a multiscale entropy (MSE) algorithm with one of a plurality of calculating scales in the step (S3). Additionally, the predetermined way further comprises a capturing period and a scale sampling standard, wherein the capturing period is n×T, n is a natural number, T is a work cycle of the rotating machine. And the predetermined way further comprises a scale sampling standard, the scale is larger than twenty.

Compared to the prior art, the invention uses the multiscale entropy algorithm to calculate the stationary time-sequence signal of the plurality of entropies. Additionally, the plurality of entropies are compared with the entropy table or the feature judgment mechanism of the entropy variation to generate the quality signal for detecting the real-time machining by a rotating machine or rotating quality of the rotating machine. Furthermore, the capturing period applied in the invention is n×T wherein n is a natural number and T is a work cycle of the rotating machine, and the scale is larger than twenty. Thus, the multiscale entropy algorithm can be applied in the field of the rotating machine and provide a tool of real-time detecting with high accuracy.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
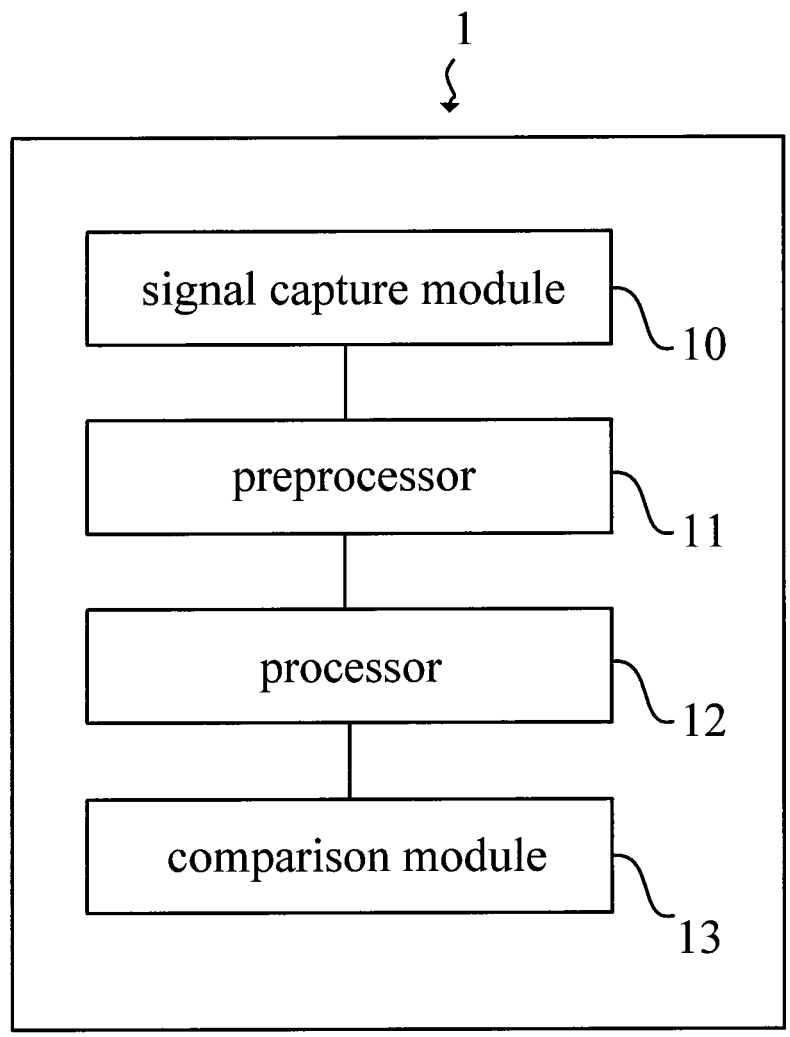
FIG. 1 illustrates a schematic diagram of a real-time detection system according to one embodiment of the invention.

Please refer to FIG. 1. FIG. 1 illustrates a schematic diagram of a real-time detection system according to one embodiment of the invention. As shown in FIG. 1, the invention discloses a real-time detection system 1 for detecting the real-time machining by a rotating machine or rotating quality of a rotating machine (not shown in FIG. 1). The real-time detection system 1 comprises a signal capture module 10, a preprocessor 11, a processor 12, and a comparison module 13.

The signal capture module 10 is used to capture a time-sequence signal of the rotating machine. In practice, the signal capture module 10 can comprise or be a piezoelectric accelerometer, a signal capturing card or a data capturing software. The time-sequence signal can be, but not limited to a signal produced by the vibration or sound of the rotating machine.

The preprocessor 11 is coupled to the signal capture module 10 for receiving the time-sequence signal and generating a stationary time-sequence signal by a Fourier Transform. The preprocessor 11 can be a computing module (not shown in FIG. 1) which is used to generate a stationary time-sequence signal by using the Fourier Transform. The Fourier Transform is a Short-Time Fourier Transform (STFT). The Short-Time Fourier Transform is used to remove the occasional stationary signals which are produced by occasional reasons, for example material defect or environmental noise. Thus, the stationary time-sequence signal will be generated.

The processor 12 is coupled to the preprocessor 11 for receiving the stationary time-sequence signal and calculating a plurality of entropies of the stationary time-sequence signal by a predetermined way. In practice, each entropy is calculated by a multiscale entropy (MSE) algorithm with one of a plurality of calculating scales. For example, the processor 12 can use the multiscale entropy algorithm with twenty calculating scales, each calculating scale of the twenty calculating scales can generate entropy separately and output each entropy to the comparison module 13. The number of the calculating scales does not be limited, but the number of the calculating scales shall be larger than 20. The number of the calculating scales can be chosen appropriately by a user.

Furthermore, it is different to apply the multiscale entropy algorithm to the rotating machine compared to the other field such as biology. When the multiscale entropy algorithm is applied to the rotating machine, the problems of the cycle and the scale sampling will cause the error about calculating. Accordingly, the processor 12 calculates the plurality of entropies according to the predetermined way. The predetermined way comprises a capturing period and a range of scale sampling standard. The capturing period is n×T, n is a natural number and T is a work cycle of the rotating machine. Additionally, the scale shall be larger than twenty. Thus, the problems of the cycle and the scale sampling will be solved.

To be noticed, the calculating way cannot be limited in the invention. The multiscale entropy algorithm shall be known by the people who have usual knowledge. Using the multiscale entropy algorithm for generating the entropy separately by each calculating scale are the scopes of the invention. The calculating way can be chosen by the user.

The comparison module 13 is coupled to the processor 12 and comprises an entropy table or a feature judgment mechanism of the entropy variation. The comparison module 13 is used to receive the plurality of entropies and compare the plurality of entropies according to the entropy table or the feature judgment mechanism of the entropy variation and generate a quality signal. In practice, the comparison module 13 is input with a plurality of standard entropies entropy previously to generate an entropy table. The entropy table comprises a plurality of entropy intervals, each entropy interval comprises at least one of the plurality of standard entropies. For example, before using the real-time detection system 1 to detect the real-time machining by a rotating machine or rotating quality of the rotating machine, the standard values of the entropy table can be corrected previously by the professionals. Thus, the plurality of entropies input by the processor 12 can be compared accurately by the comparison module 13. Additionally, in practice, the feature judgment mechanism of the entropy variation can be an image judgment, a program judgment or a logical judgment.

Furthermore, the plurality of entropy intervals are corresponded to the plurality of calculating scales. For example, the 1st~20th entropies calculated by the calculating scales can be compared to the 1st~20th entropy intervals. Wherein, each entropy interval shall comprise the ranges for instructing the different quality signal. In addition, the quality signals generated by entropy intervals can be chosen by the user. The quality signal can be a warning sound or a warning lamp.

Figure 2:
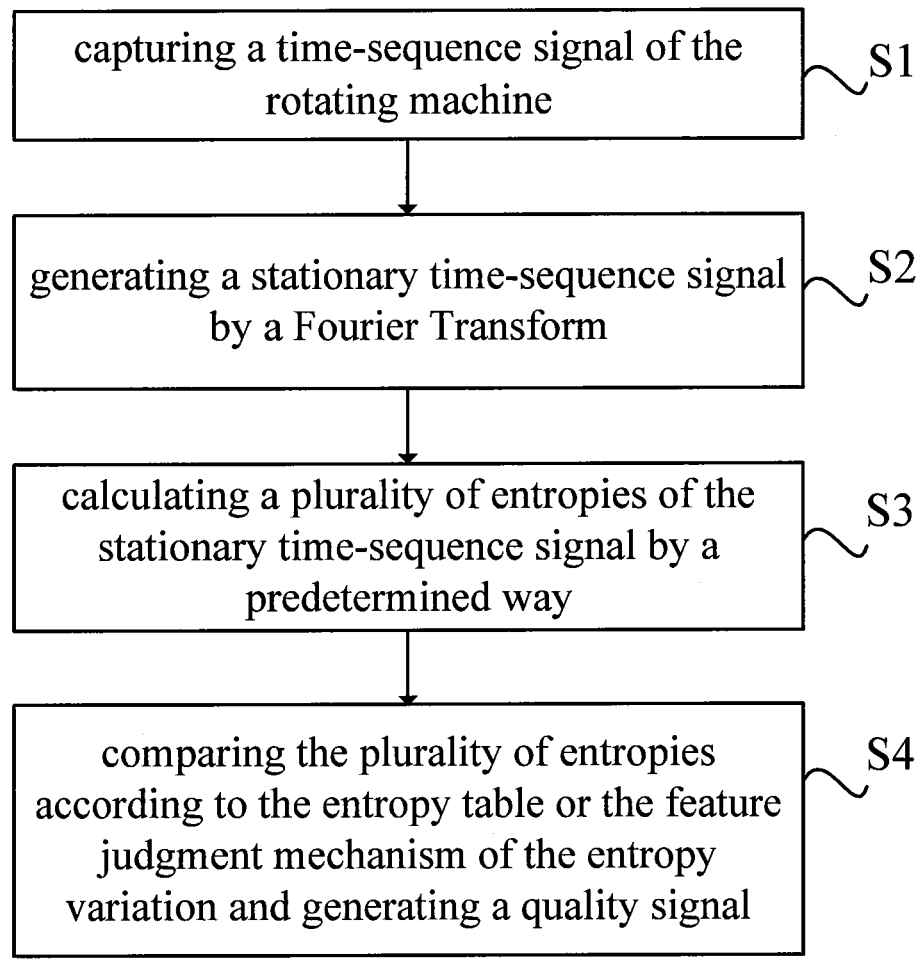
FIG. 2 illustrates a flow chart of the method of real-time detection according to one embodiment of the invention.

Please refer to FIG. 2. FIG. 2 illustrates a flow chart of the method of real-time detection according to one embodiment of the invention. As shown in FIG. 2, the invention is also to provide a method of real-time detection comprising the following steps of: (S1) capturing a time-sequence signal of the rotating machine; (S2) generating a stationary time-sequence signal by a Fourier Transform; (S3) calculating a plurality of entropies of the stationary time-sequence signal by a predetermined way and (S4) comparing the plurality of entropies according to the entropy table or the feature judgment mechanism of the entropy variation and generating a quality signal.

In step (S1), the capturing way of signal can use a piezoelectric accelerometer or a signal capturing card for capturing a time-sequence signal of the rotating machine. The time-sequence signal can be, but not limited to a signal produced by the vibration or sound of the rotating machine.

In step (S2), a stationary time-sequence signal can be generated by a Fourier Transform after receiving the time-sequence signal. The Fourier Transform is a Short-Time Fourier Transform (STFT).

In step (S3), a plurality of entropies of the stationary time-sequence signal are calculated by a predetermined way. In practice, each entropy is calculated by a multiscale entropy algorithm with one of a plurality of calculating scales. For example, each calculating scale (the first calculating scale to the twentieth calculating scale) can generate entropy (the first entropy to the twentieth entropy) separately. The number of the calculating scales cannot be limited, but the number of the calculating scales shall be larger than 20. The number of the calculating scales can be chosen appropriately by a user.

Furthermore, the predetermined way comprises a capturing period and a range of scale sampling standard. The capturing period is n×T, n is a natural number and T is a work cycle of the rotating machine. Additionally, the scale shall be larger than twenty. Thus, the problems of the cycle and the scale sampling will be solved. To be noticed, the calculating way cannot be limited in the invention. The multiscale entropy algorithm shall be known by the people who have usual knowledge. Using the multiscale entropy algorithm for generating the entropy separately by each calculating scale are the scopes of the invention. The calculating way can be chosen by the user.

In step (S4), the plurality of entropies are compared to the entropy table or the feature judgment mechanism of the entropy variation and a quality signal will be generated. In practice, a plurality of standard entropy can be input previously to generate an entropy table. The entropy table comprises a plurality of entropy intervals, each entropy interval comprises at least one of the plurality of standard entropies. For example, before detecting the real-time machining by a rotating machine or rotating quality of the rotating machine, the standard values of the entropy table can be corrected previously by the professionals. Additionally, the feature judgment mechanism of the entropy variation can be an image judgment, a program judgment or a logical judgment.

Furthermore, the plurality of entropy intervals are corresponded to the plurality of calculating scales. For example, the 1st~20th entropies calculated by the calculating scales can be compared to the 1st~20th entropy intervals. Wherein, each entropy interval shall comprise the ranges for instructing the different quality signal. In addition, the quality signals generated by entropy intervals can be chosen by the user. The quality signal can be a warning sound or a warning lamp.

Compared to the prior art, the invention uses the multiscale entropy algorithm to calculate the stationary time-sequence signal of the plurality of entropies. Additionally, the plurality of entropies are compared to the entropy table or the feature judgment mechanism of the entropy variation to generate the quality signal for detecting the real-time machining by a rotating machine or rotating quality of the rotating machine. Furthermore, the capturing period applied in the invention is n×T wherein n is a natural number and T is a work cycle of the rotating machine, and the scale is larger than twenty. Thus, the multiscale entropy algorithm can be applied in the field of the rotating machine and provide a tool of real-time detecting with high accuracy.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A real-time detection system for detecting the real-time machining by a rotating machine or rotating quality of a rotating machine comprising:
    a signal capture module for capturing a time-sequence signal of the rotating machine;
    a preprocessor coupled to the signal capture module for receiving the time-sequence signal and generating a stationary time-sequence signal by a Fourier Transform;
    a processor coupled to the preprocessor for receiving the stationary time-sequence signal and calculating a plurality of entropies of the stationary time-sequence signal by a predetermined way; and
    a comparison module with an entropy table or a feature judgment mechanism of the entropy variation, coupled to the processor, receiving the plurality of entropies and comparing the plurality of entropies according to the entropy table or the feature judgment mechanism of the entropy variation and generating a quality signal.

2. The real-time detection system of claim 1, wherein the predetermined way comprises a range of data capturing, the range of data capturing is n×T, n is a natural number, T is a work cycle of the rotating machine.

3. The real-time detection system of claim 2, wherein the predetermined way further comprises a scale sampling standard, and the scale is larger than twenty.

4. The real-time detection system of claim 1, wherein each entropy is calculated by a multiscale entropy (MSE) algorithm with one of a plurality of calculating scales.

5. The real-time detection system of claim 1, wherein the comparison module is input with a plurality of standard entropies previously to generate an entropy table.

6. The real-time detection system of claim 5, wherein the entropy table comprises a plurality of entropy intervals, and each entropy interval comprises at least one of the plurality of standard entropies.

7. The real-time detection system of claim 1, wherein the Fourier Transform is a Short-Time Fourier Transform (STFT).

8. The real-time detection system of claim 1, wherein the quality signal can be a warning sound or a warning lamp.

9. The real-time detection system of claim 1, wherein the feature judgment mechanism of the entropy variation can be an image judgment, a program judgment or a logical judgment.

\* \* \* \* \*